United States Patent
Yuasa

(10) Patent No.: US 7,029,801 B2
(45) Date of Patent: Apr. 18, 2006

(54) METHOD OF MANUFACTURING MASK FOR ELECTRON BEAM LITHOGRAPHY AND MASK BLANK FOR ELECTRON BEAM LITHOGRAPHY

(75) Inventor: Mitsuhiro Yuasa, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 50 days.

(21) Appl. No.: 10/303,847

(22) Filed: Nov. 26, 2002

(65) Prior Publication Data

US 2003/0104287 A1 Jun. 5, 2003

(30) Foreign Application Priority Data

Dec. 4, 2001 (JP) .............................. 2001-370579

(51) Int. Cl.
*G03F 9/00* (2006.01)
*G03C 5/00* (2006.01)

(52) U.S. Cl. .......................... 430/5; 430/296; 430/313; 430/314; 430/316; 430/942

(58) Field of Classification Search .................... 430/5, 430/296, 942, 313, 314, 316; 378/35
See application file for complete search history.

(56) References Cited

U.S. PATENT DOCUMENTS 4,068,018 A * 1/1978 Hashimoto et al. ............ 430/5
5,908,719 A * 6/1999 Guckel et al. .................. 430/5
6,428,937 B1 * 8/2002 Katakura ........................ 430/5

FOREIGN PATENT DOCUMENTS

| JP | 05-216216 | 8/1993 |
| JP | 10-340852 | 12/1998 |
| JP | 2001-077013 | 3/2001 |

OTHER PUBLICATIONS

Japanese Patent Office Action, dated Dec. 7, 2004.

* cited by examiner

*Primary Examiner*—Christopher G. Young
(74) *Attorney, Agent, or Firm*—Crowell & Moring LLP

(57) ABSTRACT

This invention provides a method of manufacturing mask for electron beam lithography and a mask blank for electron beam lithography, which could prevent damage upon a front side of an SOI (Silicon On Insulator) layer and also provide desirable etching of a silicon base layer of an SOI substrate is used.

A mask blank for electron beam lithography is manufactured as an intermediary product by etching a silicon base layer and a BOX layer subsequent to forming a protective layer on a front side of an SOI (Silicon On Insulator) layer simultaneously with forming a hard mask on a back side of the SOI layer. Then, an etching process is performed upon the SOI layer to thereby complete a manufacture process of a mask for electron beam lithography having an aperture for transmitting an electron beam therethrough.

6 Claims, 10 Drawing Sheets

SOI LAYER 11
BOX LAYER (INSULATING LAYER) 12
SILICON BASE LAYER 13
10 SOI SUBSTRATE

PROTECTIVE LAYER 14
HARD MASK 15

FLIPPED UPSIDE-DOWN

RESIST FILM (RESIST MASK) 16

PROTECTIVE LAYER 14
SOI LAYER 11
BOX LAYER (INSULATING LAYER) 12
SILICON BASE LAYER 13
HARD MASK 15
FILLING MATERIAL 18

FLIPPED UPSIDE-DOWN

19
RESIST FILM (RESIST MASK)

APERTURE 21

- SOI LAYER 11
- BOX LAYER (INSULATING LAYER) 12
- SILICON BASE LAYER 13
- FILLING MATERIAL 18

30 MASK FOR ELECTRON BEAM LITHOGRAPHY

SOI LAYER 2
BOX LAYER (INSULATING LAYER) 3
SILICON BASE LAYER 4
RESIST FILM (RESIST MASK) 5
1 SOI SUBSTRATE

6 SPACE PORTION

7 RESIST FILM (RESIST MASK)

8 APERTURE

METHOD OF MANUFACTURING MASK FOR ELECTRON BEAM LITHOGRAPHY AND MASK BLANK FOR ELECTRON BEAM LITHOGRAPHY

BACKGROUND OF THE INVENTION

1. Field of the Invention

The present invention generally relates to a method for manufacturing a mask for electron beam lithography and a mask blank for electron beam lithography.

2. Description of the Related Art

In general, a semiconductor integrated circuit or the like is formed by repetitively performing a variety of processes (e.g. deposition, oxidation, diffusion, etching) upon a semiconductor wafer.

Owing to today's very large scale integration of the semiconductor device, there is a need to form, for example, oxidized layers, or metal wires on a semiconductor wafer in submicroscopic sizes.

Therefore, a lithographic technique for forming submicroscopic patterns, and an etching technique for anisotropically etching a resist film having a sub-microscopic pattern formed thereto are indispensable in fulfilling such need.

RIE (Reactive Ion Etching) providing highly anisotropic etching is one preferable example of the aforementioned etching technique.

Meanwhile, electron beam lithography is drawing attention as the aforementioned lithographic technique.

A projection aligner for demagnification may be used for electron beam lithography, in which a pattern is developed by demagnifying the pattern of a photomask (reticle) via a lens, and then by exposing the pattern upon a wafer having photo resist applied thereto. A projection aligner for equal magnification may also be used for electron beam lithography, in which a pattern of a photomask (reticle) is developed upon a wafer having photo resist applied thereto by exposing the pattern through a lens.

Although the projection aligner for equal magnification could be used in a case where the design rule for the target wafer is a relatively large pattern, or in a case where the photomask (reticle) is formed with a microscopic pattern, the projection aligner for demagnification is, in general, more preferably used in such cases.

The photomask (reticle) can be categorized into a stencil type and a membrane type based on the difference in the degree of transmitting an electron beam therethrough.

The stencil type mask (hereinafter referred as "lithographic mask") is formed of a silicon layer having a sufficient thickness (approximately 2 micrometers) for preventing transmittance of an electron beam except at an aperture portion thereof, an insulating layer disposed below the silicon layer, and another silicon layer disposed below the insulating layer having a thickness of approximately several hundred micrometers to 600 micrometers for ensuring a certain rigidity.

The lithographic mask having the foregoing structure is preferably manufactured by employing an SOI (Silicon On Insulator) substrate having an SOI layer, a silicon base layer disposed below the SOI layer, and a BOX (Buried Oxide Layer) layer serving as an insulating layer disposed between the SOI layer and the silicon base layer.

A conventional manufacturing method of a lithographic mask using an SOI substrate will hereinafter be described with reference to FIG. 7A to FIG. 7E.

An SOI substrate 1 is formed of, for example, a BOX layer 3 serving as an insulating layer composed of $SiO_2$ with a thickness of approximately a few micrometers, a silicon base layer 4 disposed beneath the BOX layer 3 having a thickness of approximately 600 micrometers, and an SOI layer 2 having a thickness of approximately 2 micrometers disposed on the BOX layer 3 (see FIG. 7A). It is to be noted that the thickness for each layer in the accompanying drawings including FIG. 7A to FIG. 7E are not illustrated in accordance with the ratio of the actual size.

In manufacturing a lithographic mask using the SOI substrate 1, a back side of the silicon base layer 4 is first coated with resist, and is then lithographically processed to form a resist film 5 (resist mask) with a desired pattern thereon (See FIG. 7A).

Next, with the use of the resist film 5 as a mask, the silicon base layer 4 is dry etched, that is, anisotropically etched with a gas containing Halogen or the like, to thereby form a pattern (See FIG. 7B).

Next, with the use of the silicon base layer 4 as a mask, the BOX layer 3 is dry etched, for example, with plasma containing an F radical such as $CF_4$ The resist film 5 is then removed by ashing with oxygen plasma (FIG. 7C).

Next, a front side of the SOI layer 2 is coated with resist, and is then formed with a resist film 7 (resist mask) having a desired pattern by employing a lithographic process or the like (See FIG. 7D).

Next, with the use of the resist film 7 as a mask, the SOI layer 2 is dry etched, that is, anisotropically etched with a gas containing Halogen or the like, to thereby form a pattern. Finally, the resist film 7 is then removed by ashing with oxygen plasma to thereby complete manufacturing a stencil type mask 9 having an aperture 8 in the SOI layer 2 for transmitting an electron beam therethrough (See FIG. 7E).

In order to lithographically process the silicon base layer of the SOI substrate and then etch the silicon base layer and the BOX layer, the conventional method of manufacturing a lithographic mask requires the SOI substrate to be flipped in a state having a back side thereof (the side of the silicon base layer) faced upward and a front side thereof faced downward, in which the SOI substrate maintaining such state is fixed to a vacuum chuck or an electrostatic chuck for further conveyance or processing. Therefore, the conventional method of manufacturing a lithographic mask risks damaging the front side of the SOI layer when conveying or processing the SOI substrate, and may not be able to form a desired pattern.

Furthermore, in a case where the silicon base layer has a considerable thickness, forming a resist film with a typical thickness of a few micrometers would not be enough to prevent etching damage. Therefore, in order to ensure resistance against such etching damage, the resist film is required to be formed with a thickness of several ten to several hundred micrometers. Forming the resist film with such thickness is however inconvenient and causes complication in a coating process since the coating procedure is required to be performed repetitively for numerous times. Forming the resist film with such thickness could also cause difficulty in thoroughly removing etching residue in a cleaning process subsequent to an ashing process.

In order to lithographically process and then etch the SOI layer, the conventional method of manufacturing a lithographic mask requires the SOI substrate to be fixed to a vacuum chuck or an electrostatic chuck on the side of the silicon base layer (bottom side of the SOI substrate). Fixing the SOI substrate in such manner however could cause a problem such as deformation or damage to the SOI layer owing to the presence of a space portion (aperture) 6 shown in FIG. 7C.

It is therefore an object of the present invention to provide a method of manufacturing a mask for electron beam lithography and a mask blank for electron beam lithography, which could prevent a front side of an SOI layer of an SOI substrate from being damaged, and provide a mask for suitably etching a silicon base layer of an SOI substrate.

It is also an object of the present invention to provide a method of manufacturing a mask for electron beam lithography and a mask blank for electron beam lithography, which could prevent a problem, for example, deformation of an SOI layer in an etching process or the like, caused by the presence of a space portion formed at a silicon base layer.

SUMMARY OF THE INVENTION

It is a general object of the present invention to provide a method of manufacturing a mask for electron beam lithography and a mask blank for electron beam lithography that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a method of manufacturing a mask for electron beam lithography and a mask blank for electron beam lithography particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a method for manufacturing a mask for electron beam lithography, including the steps of: obtaining an SOI substrate having a silicon base layer, an insulating layer arranged on the silicon base layer, and an SOI layer arranged on the insulating layer; forming a protective layer on a front side of the SOI layer; etching the silicon base layer, and the insulating layer; removing the protective layer formed on the front side of the SOI layer; and etching the SOI layer.

It is to be noted that the mask for electron beam lithography is a stencil type mask serving as a photomask (reticle) used in electron beam lithography with a projection aligner for demagnification or a projection aligner for equal magnification. Although a material such as SiN or $AL_2O_3$ could be used as a material for the insulating layer of the SOI substrate, it is preferable to form the insulating layer as a buried $SIO_2$ layer (BOX layer, Buried Oxide Layer). The protective layer is not to be restricted in particular as long as the protective layer is able to provide the same advantages described in the present invention. Therefore, an oxide layer, a nitride layer, a metal layer or the like may be used as the protective layer. Although there is no particular restriction in the thickness of the protective layer, a thickness of approximately 5 to 15 micrometers is sufficient.

Since the protective layer disposed on the front side of the SOI layer (front side of the SOI substrate) is removed, for example, immediately before a process of forming a resist mask (resist film) on the front side of the SOI layer, the front side of the SOI layer would not be damaged by a chuck or the like in a case such as processing the silicon base layer. Therefore, the SOI layer can be patterned with no defect.

Another method for manufacturing a mask for electron beam lithography to which the present invention is applied, includes the steps of: obtaining an SOI substrate having a silicon base layer, an insulating layer arranged on the silicon base layer, and an SOI layer arranged on the insulating layer; forming a protective layer on a front side of the SOI layer simultaneously with forming a hard mask on a back side of the silicon base layer; etching the silicon base layer, and the insulating layer; removing the protective layer formed on the front side of the SOI layer and the hard mask formed on the back side of the silicon base layer; and etching the SOI layer.

Accordingly, the protective layer and the hard mask can be formed easily at once, manufacture performance and productivity can be enhanced, and manufacture facilities can be utilized efficiently.

For example, in a case where a thermal processing apparatus is employed for thermally processing the front side and the back side of the SOI substrate simultaneously, the thermal process is performed based on the conditions necessary for forming the hard mask, owing to the fact that the hard mask relatively requires more thickness than the protective layer.

A single wafer process type thermal processing apparatus may be employed to form the SOI substrate one at a time. However, from the aspect of productivity, it is more preferable to employ a batch type thermal processing apparatus for forming plural SOI substrates at once by disposing the substrates on a substrate board thereof.

Another method for manufacturing a mask for electron beam lithography to which the present invention is applied, further includes the steps of: filling a filling material into a space portion formed by the etching of the silicon base layer and the insulating layer; and removing the filling material from the space portion after the SOI layer is etched.

Filling the filling material into the space portion could prevent the space portion from causing problems during an etching process or the like. That is, no deformation or damage is caused to the SOI layer when the side of the silicon base layer of the SOI substrate is stuck to a vacuum chuck for forming a resist film on the SOI layer by spin-coating or the like. No loss of electrostatic attraction force in relation to the depth of the space portion (distance from a surface of the vacuum chuck) is caused when the side of the silicon base layer of the SOI substrate is stuck to an electrostatic chuck for etching the SOI layer. No irregular electrical discharge would be caused when the SOI layer is etched. Furthermore, the silicon base layer can be etched in a uniform temperature since an even flow of cooling gas from a susceptor can be achieved.

A mask blank for electron beam lithography to which the present invention is applied includes an SOI substrate having a silicon base layer, an insulating layer arranged on the silicon base layer, and an SOI layer arranged on the insulating layer, and a protective layer formed at least on a front side of the SOI layer, wherein the mask blank is prepared as a blank for forming a mask having an aperture formed thereto.

The mask blank for electron beam lithography serves as an intermediary product of a mask for electron beam lithography. The mask blank is prepared in a state where a mask for electron beam lithography can be completed by etching the SOI layer after forming a resist mask (resist film) thereto.

Thus structured, the mask blank can prevent a chuck or the like from damaging the front side of the SOI layer, for example, when the silicon base layer is processed. Therefore, the SOI layer can be patterned with no defect. Furthermore, the mask blank enables a resist mask to be formed on a back side of a silicon base layer without any complicated procedure, and also prevents problems caused by resist residue (scum) remaining thereto.

Another mask blank for electron beam lithography to which the present invention is applied, further includes a hard mask formed on a back side of the silicon base layer.

Accordingly, the front side of the SOI layer and the back side of the silicon base layer can be protected from damage when handling (e.g. transporting, storing) the mask blank as an intermediary product.

Another mask blank for electron beam lithography to which the present invention is applied, includes an SOI substrate having a silicon base layer, an insulating layer arranged on the silicon base layer, and an SOI layer arranged on the insulating layer; a protective layer formed at least on a front side of the Sol layer; and a filling material filled inside a space portion in the silicon base layer and the insulating layer, wherein the mask blank is prepared as a blank for forming a mask having an aperture formed thereto.

Another mask blank for electron beam lithography to which the present invention is applied, further includes a hard mask formed on a back side of the silicon base layer.

Therefore, other than obtaining the same benefits as those of the aforementioned mask blank formed with the protective layer and the hard mask, this mask blank can also prevent the space portion from causing problems during an etching process or the like.

Other objects and further features of the present invention will be apparent from the following detailed description when read in conjunction with the accompanying drawings.

BRIEF DESCRIPTION OF THE DRAWINGS

FIG. 1A to FIG. 1D are drawings for explaining a method for manufacturing a mask for electron beam lithography to which the present invention is applied, wherein FIG. 1A shows an SOI substrate, FIG. 1B shows a process of forming a protective layer and a hard mask, FIG. 1C shows a process of flipping an SOI substrate upside-down, and FIG. 1D shows a process of forming a resist film on a hard mask;

FIG. 2A to FIG. 2D are drawings for explaining a method for manufacturing a mask for electron beam lithography to which the present invention is applied, wherein FIG. 2A shows a process of dry etching a hard mask, FIG. 2B shows a process of ashing a hard mask and removing a resist film after subsequent to etching of the hard mask, FIG. 2C shows a process of dry etching a BOX layer and manufacturing a lithographical mask blank, and FIG. 2D shows a process of filling a filling material into a space portion;

FIG. 3A to FIG. 3D are drawings for explaining a method for manufacturing a mask for electron beam lithography to which the present invention is applied, wherein FIG. 3A shows a process of flipping a mask blank upside-down, FIG. 3B shows a process of cleaning and removing resist residue (scum) subsequent to wet etching a mask blank and removing a protective layer, FIG. 3C shows a process of forming a resist film on a front side of an SOI layer, and FIG. 3D shows a process of dry etching an SOI layer and forming an aperture;

FIG. 4A to FIG. 4B are drawings for explaining a method for manufacturing a mask for electron beam lithography to which the present invention is applied, wherein FIG. 4A shows a process of removing a resist film by ashing, FIG. 4B shows a process of completing the manufacture of a mask for electron beam lithography by cleaning and removing resist residue (scum) subsequent to wet etching the mask and removing a filling material;

FIG. 7A to FIG. 7E are drawings for explaining a conventional method for manufacturing a mask for electron beam lithography, wherein FIG. 7A shows a process of forming a resist film on a back side of a silicon base layer of an SOI substrate, FIG. 7B shows a process of etching a silicon base layer, FIG. 7C shows a process of etching a BOX layer, FIG. 7D shows a process of forming a resist film on a front side of an SOI layer, and FIG. 7E shows a process of completing the manufacture of a mask for electron beam lithography by etching an SOI layer;

DESCRIPTION OF THE PREFERRED EMBODIMENTS

In the following, embodiments of the present invention regarding a method for manufacturing a mask for electron beam lithography and a mask blank for electron beam lithography will be described with reference to the accompanying drawings.

An embodiment regarding a method for manufacturing a mask for electron beam lithography will be described with reference to FIG. 1A to FIG. 4B.

First, an SOI substrate 10 is prepared as a material for manufacturing a mask for electron beam lithography (hereinafter simply referred as "lithographic mask"). The SOI substrate 10 has, for example, a silicon base layer 13 with a thickness of approximately 600 micrometers, a BOX layer 12 (Buried Oxide Layer) arranged above the silicon base layer 13 for serving as an $SiO_2$ insulating layer with a thickness of approximately few micrometers, and an SOI layer 11 arranged above the BOX layer 12 with a thickness of approximately few micrometers (See FIG. 1A).

Figure 1A:
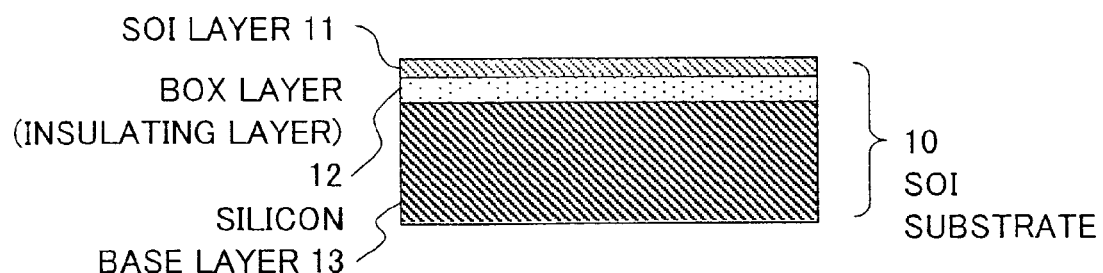
Figure 1B:
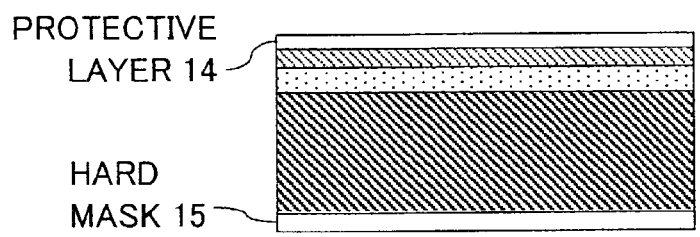

After the SOI substrate 10 is thermally processed through a thermal processing apparatus, a protective layer 14 of a prescribed thickness is formed on a front side of the SOI substrate 10, that is, on a front side of the SOI layer 11 (a top side of the SOI substrate 10), and a hard mask 15 of a prescribed thickness is formed on a back side of the SOI substrate 10, that is, on a back side of the silicon base layer 13 (a bottom side of the SOI substrate 10) (Protective layer forming process, Hard mask forming process, or Simultaneous protective layer and hard mask forming process, See FIG. 1B).

Figure 5:
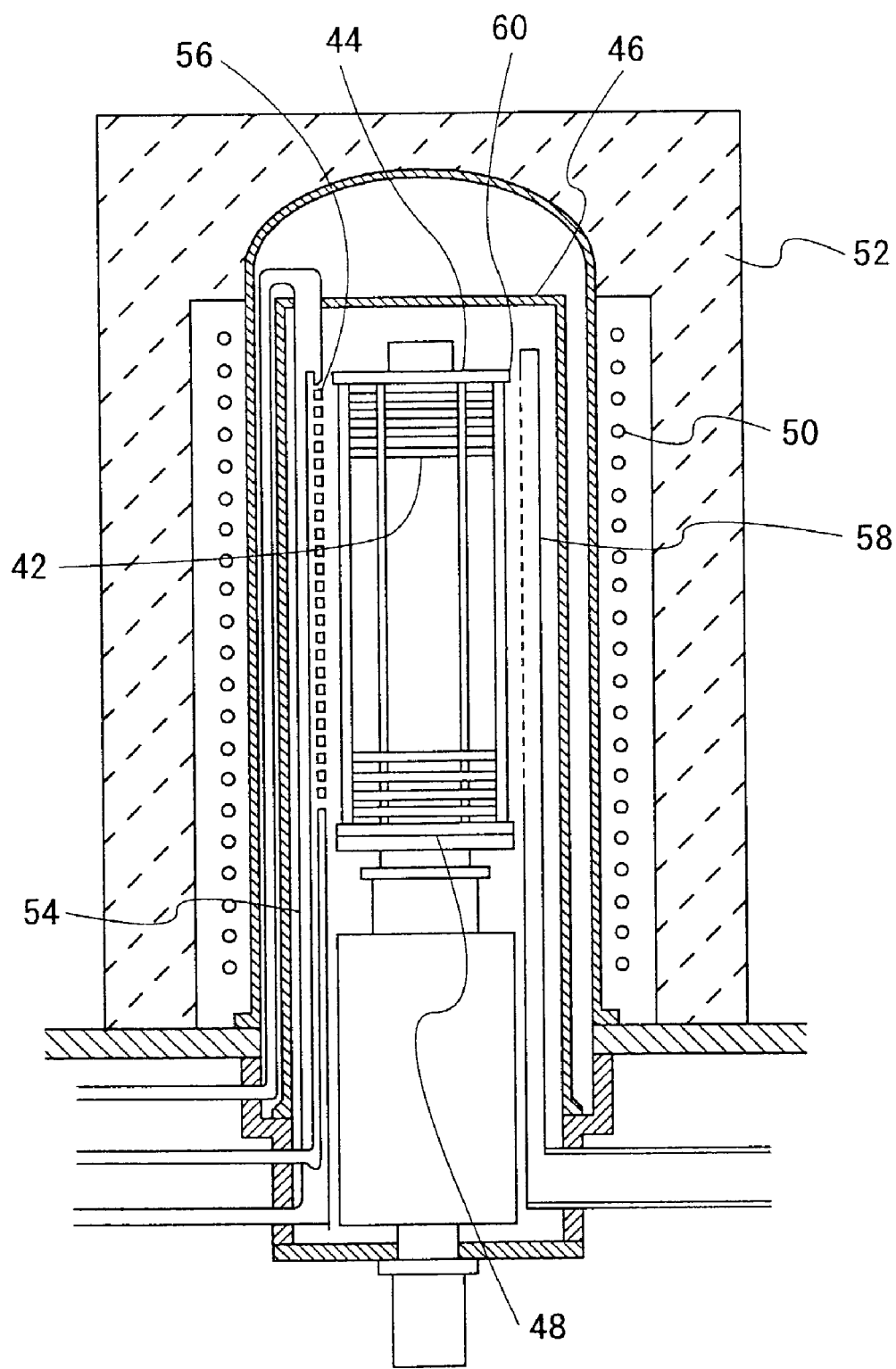
FIG. 5 is a schematic cross-sectional view showing a batch process type thermal processing apparatus employed to a method for manufacturing a mask for electron beam lithography to which the present invention is applied.
Figure 6:
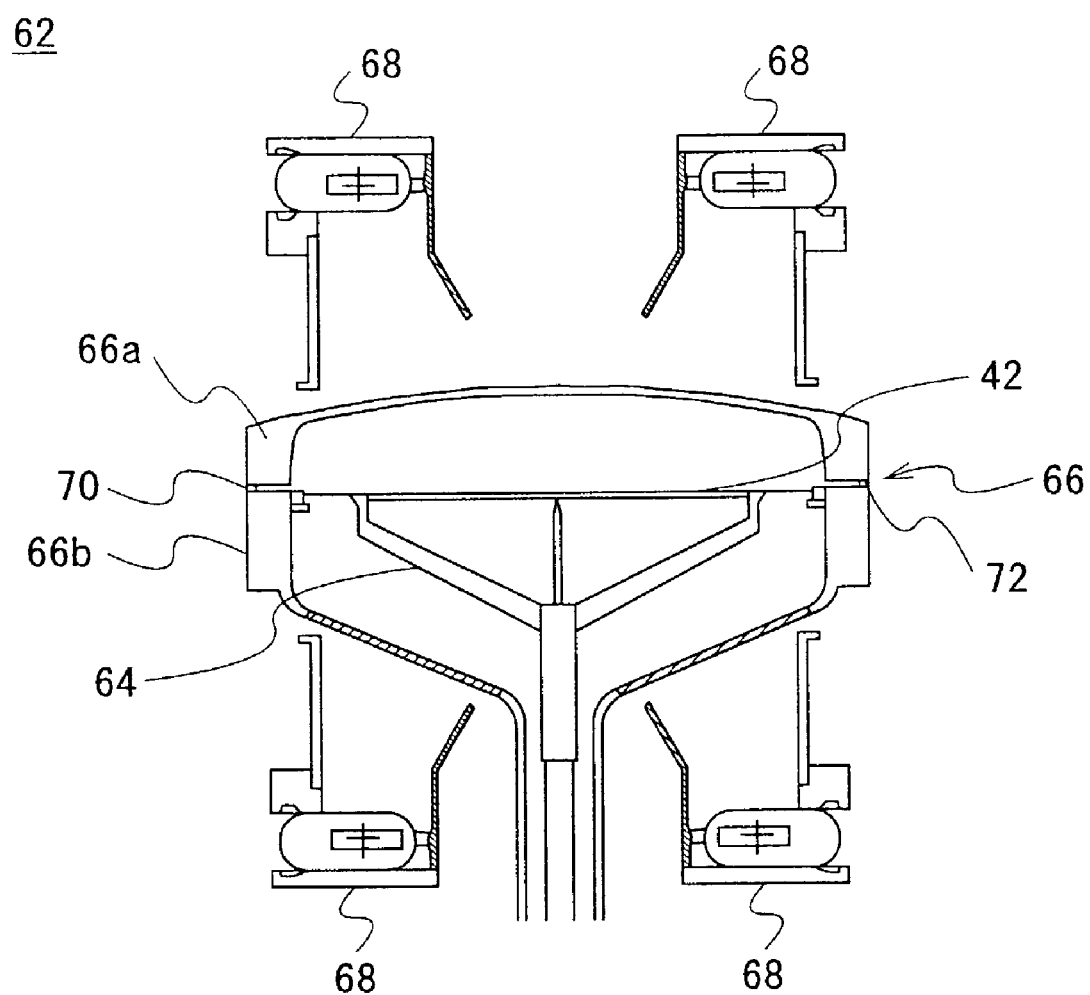
FIG. 6 is a schematic cross-sectional view showing a single wafer process type thermal processing apparatus employed to a method for manufacturing a mask for electron beam lithography to which the present invention is applied.
Figure 7A:
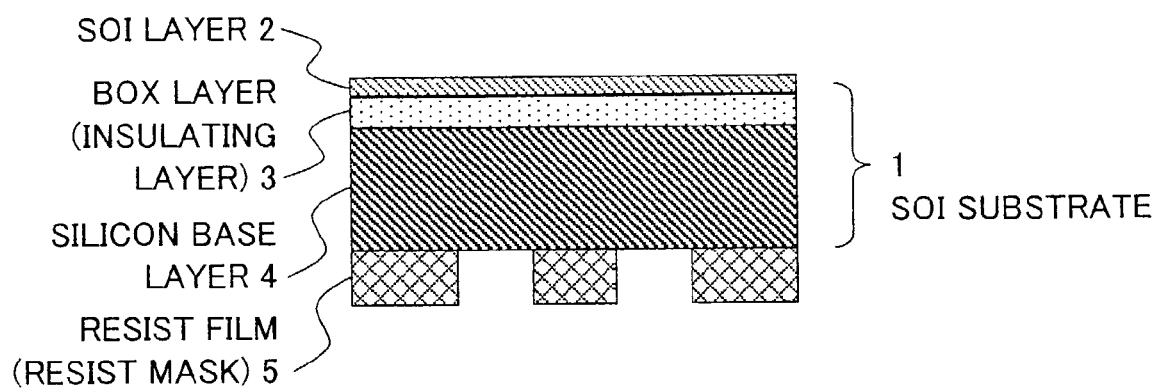
Figure 7B:
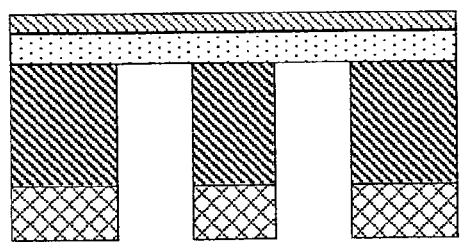
Figure 7C:
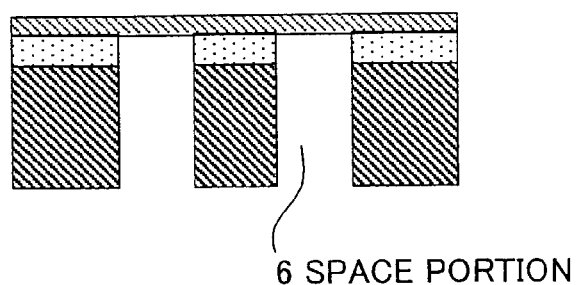
Figure 7D:
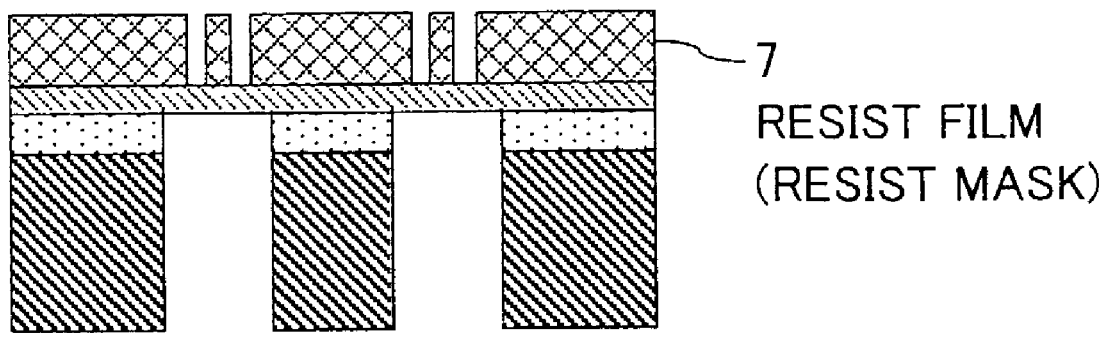
Figure 7E:
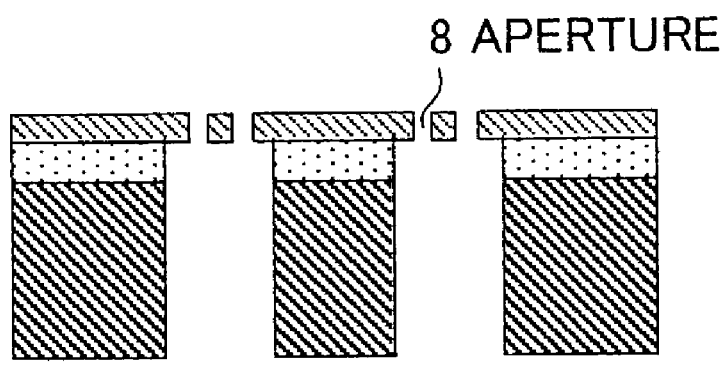

A batch process type thermal processing apparatus 40 shown in FIG. 5, or a single wafer process type thermal processing apparatus 62 shown in FIG. 6 may be used as the thermal processing facility.

The batch process type thermal processing apparatus shown 40 in FIG. 5 is one example of a vertical thermal processing apparatus. With the thermal processing apparatus 40, plural substrates 42 are racked on a substrate board 44 and housed inside a reaction container 46 having a cylindrical double-layered tubular form. The substrate board 44 is mounted on a turntable 48, which is connected to a rotary driving mechanism (not shown) arranged outside the thermal processing apparatus 40. A resistance heating element 50 with a coil shape or the like is disposed in an outer periphery of the reaction container 46 and is spaced with a prescribed interval with respect to an outer surface. A heat insulation layer 52 is disposed surrounding the resistance heating element 50.

A quartz gas guidance pipe 54 or the like for supplying reaction gas during a deposition process has plural nozzles 56 opened in both directions toward the front side and back side of each substrate 42 disposed on the substrate board 44. Likewise, an exhaust pipe 58 has plural exhaust ports 60 disposed opposite from the nozzles 56 and opened in both directions toward the front side and back side of each substrate 42.

Thus structured, the thermal processing apparatus 40 performs the deposition process by flowing supplied gas in a single direction to the front and back side of each substrate 42 in a uniform manner, and then by thermally processing the front and back sides of the plural substrates 42 at once.

In the single wafer process type thermal processing apparatus 62 shown in FIG. 6, a single substrate 42 is arranged on a susceptor 64 in a manner which the peripheral rim of the substrate 42 is fixed to the susceptor 64. The susceptor 64 is rotatably connected to a rotary driving mechanism (not shown). The susceptor 64 is housed inside a chamber 66 having an upper dome portion 66a and a lower dome portion 66b. The upper dome portion 66a and the lower dome portion 66b are formed of a transparent quartz material. Plural lamps 68 serving as heating sources is arranged above and below the chamber 6 for heating the inside of the chamber 66 via the upper dome portion 66a and the lower dome portion 66b.

A quartz gas guidance pipe (not shown) or the like for supplying reaction gas during a deposition process has a nozzle 70 opened on a side wall of the chamber 66 in a direction toward one side of the substrate 42. Likewise, an exhaust pipe (not shown) has an exhaust port 72 disposed opposite from the nozzle 70 and opened in a direction toward another side of the substrate 42.

Thus structured, the thermal processing apparatus 62 performs the deposition process by flowing supplied gas in a single direction to the front and back side of a single substrate 42 in a uniform manner, and then by thermally processing the front and back side of the substrate 42.

The batch process type thermal processing apparatus 40 being able to form the protective layer 14 and the hard mask 15 at once is more preferable in terms of efficient productivity.

The protective layer 14 and the hard mask 15 can be formed with the thermal processing apparatus 40 under processing conditions, such as, a 3 hour process in an oxygen contained gas atmosphere of 850° C. Accordingly, the protective layer 14 and the hard mask 15, for example, constituted of $SiO_2$ can be formed with a thickness of 10 micrometers.

It is to be noted that the formation of the protective layer 14 with a thickness of 10 micrometers causes to reduce the initial thickness of the SOI layer 11 since a portion of the SOI layer 11 is oxidized. Therefore, the initial thickness of the SOI layer 11 should be determined with consideration that the SOI layer 11 is desired to have a thickness of approximately 2 micrometers for employing the SOI substrate 10 as a lithographic mask.

Figure 1C:
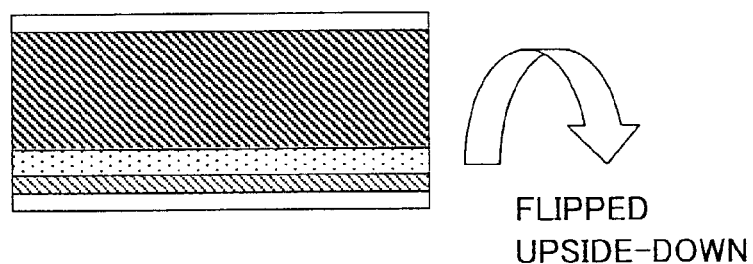
Figure 1D:
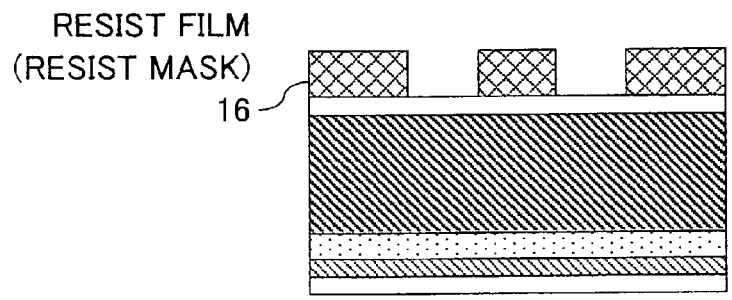

A transportation apparatus (not shown) removes the SOI substrate 10 formed with the protective layer 14 and the hard mask 15 from the thermal processing apparatus and flips the SOI substrate 10 upside-down (see FIG. 1C).

Subsequently, a spin coater (not shown) or the like spin-coats resist upon the back side of the silicon base layer 13, that is, the front side of the hard mask 15 so as to form a spin-coated layer having, for example, a 3 micrometer thickness. In such a case, the SOI substrate 10 is processed in a manner where the front side of the protective layer 14 is stuck by vacuum suction to a substrate chuck of the spin coater. The SOI substrate 10 maintaining the flipped state is then transported on top of a stage of a stepper (not shown) or the like, and is lithographically processed for forming a resist film (resist mask) 16 having a prescribed pattern (see FIG. 1D).

It is to be noted that the front side of the SOI layer 11 may be damaged or a patterning process (described afterwards) may be adversely affected with use of a conventional method since the SOI substrate 10 is transported and processed in a manner where the front side of the SOI layer 11 is stuck or fixed upon a vacuum chuck of the transportation apparatus (not shown), the substrate chuck of the spin coater (not shown), or the stage of the stepper (not shown).

This embodiment, on the other hand, is able to prevent damage upon the front side of the SOI layer 11 since the protective layer 14 formed on the front side of the SOI layer 11 serves to protect the front side of the SOI layer 11.

The SOI substrate 10 maintaining the flipped state is then transported, for example, to an RIE apparatus (not shown). With the resist film 16 serving as a mask, the hard mask 15 is dry etched with a gas containing $CHF_3$, $CF_4$ or the like, thereby exposing the silicon base layer 13 (see FIG. 2A). Simultaneous to this dry etching process is a partial removal of an upper portion of the resist film 16. The remaining portion of the resist film 16 is then removed by ashing with oxygen plasma (see FIG. 2B). It is, however, possible to omit the ashing process and to advance to a next process.

With the etched hard mask 15 serving as a mask, the silicon base layer 13 is dry etched with a halogen-based gas (e.g. $SF_6$). Simultaneous to this dry etching process of the silicon base layer is a partial or entire removal of an upper portion of the hard mask 15. In a case where the ashing process of the resist film 16 is omitted in the aforementioned dry etching process of the hard mask 15, the resist film 16 may be removed in this dry-etching process of the silicon base layer 13.

In the process of dry etching the silicon base layer 13 with the conventional method, the resist film is required to be formed with a thickness of approximately 100 micrometers in a case where the resist film is used as a mask for dry etching the silicon base layer 13 having a thickness of 600 micrometers. The formation of the resist film with such thickness causes complication in a coating process since the coating procedure is required to be performed repetitively for numerous times. Subsequent to the dry-etching process, the thick resist film may not be thoroughly removed due to the thick resist film, thereby causing scum from the ashing process or the etching process to remain. The resist film 16 for this embodiment, on the other hand, can be formed as a thin film requiring a thickness of approximately 3 micrometers for etching the hard mask 15, thereby enabling the thick silicon base layer 13 to be etched by using an etched thin hard mask 15 having a thickness of approximately 10 micrometers as a mask.

Figure 2A:
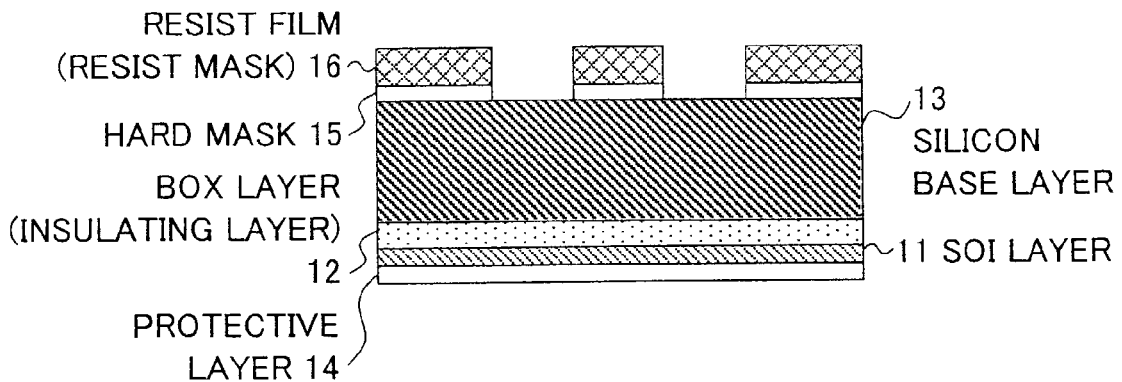
Figure 2B:
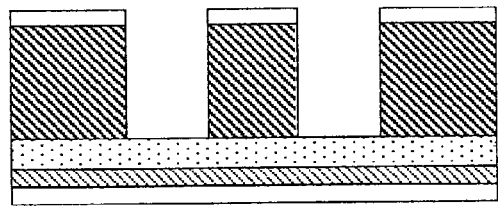
Figure 2C:
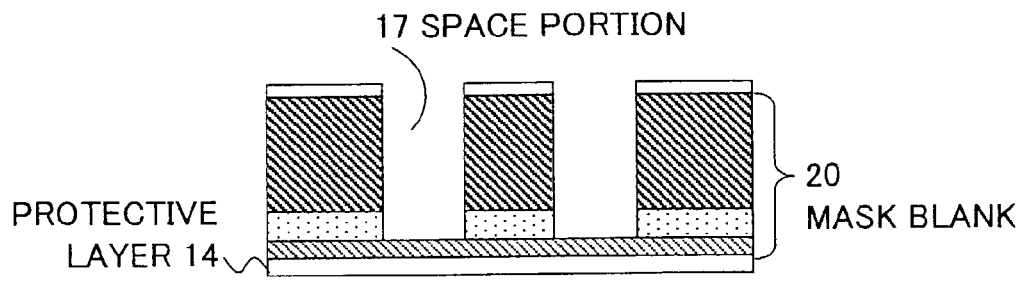

Next, the BOX layer 12 is dry etched with plasma containing an F radical such as $CHF_3$, $CF_4$ (See FIG. 2C). Accordingly, a space portion (aperture) 17 is formed in the silicon base layer 13 and the BOX layer 12 of the SOI substrate 10.

The aforementioned processes starting from the dry etching process of the hard mask 15 to the dry etching process of the BOX layer 12 may be performed consecutively.

A wet etching technique using an HF solution or the like may be employed for the BOX layer 12, instead of employing the dry etching technique.

In consequence to each of the aforementioned processes, the SOI substrate 10 formed with the space portion 17 shown in FIG. 2C serves as a mask blank for electron beam lithography (hereinafter indicated with numeral 20 and referred as "mask blank"), and serves as an intermediary product of a lithographic mask. The mask blank 20 has a form prepared to be manufactured as a completed lithographic mask, in which the completed lithographic mask is able to be manufactured afterwards by coating the SOI layer 11 of the mask blank 20 with resist and then by etching the mask blank 20. Besides manufacturing the completed lithographic mask in a continuous and uniform process with use of the mask blank 20, the mask blank 20 may be sold to other manufacturers as a product aimed to be manufactured as the completed lithographic mask.

Figure 2D:
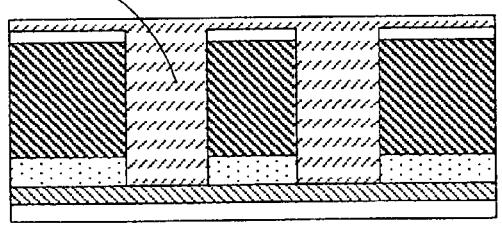

As shown in FIG. 2D, the mask blank 20 may also be formed in a manner having a filling material 18 filled into the space portion 17 (described afterwards).

The mask blank 20 shown in FIG. 2C is then subject to a filling process for filling the filling material 18 into the space portion 17 (Filling process, FIG. 2D), in which the filling material 18 is filled, for example, by the spin-coating method or a chemical evaporation method. Preferably, a material such as an SOG film, an $SiO_2$ film, an organic SOG film, or an organic resist film is to be used as the filling material 18. For example, the mask blank 20 is spin-coated with an organic SOG film and is then baked for approximately 30 seconds in a temperature of 150° C., thereby allowing the filling material 18 to be filled therein.

In such a case, the filling material 18 may be applied to form an equal level surface with respect to the hard mask 15, or a higher level surface with respect to the top surface of the hard mask 15 as shown in FIG. 2D.

The mask blank 20, shown in FIG. 2D, having the filling material 18 filled therein has an advantage of preventing damage, such as deformation of the SOI layer 11 during handling of the mask blank 20. It is now to be noted that the mask blank 20, instead of being formed in a state shown in FIG. 2D, may be formed by first etching the hard mask 15 in a state shown in FIG. 2C and then by filling the filling material 18 into the space portion 17.

Figure 3A:
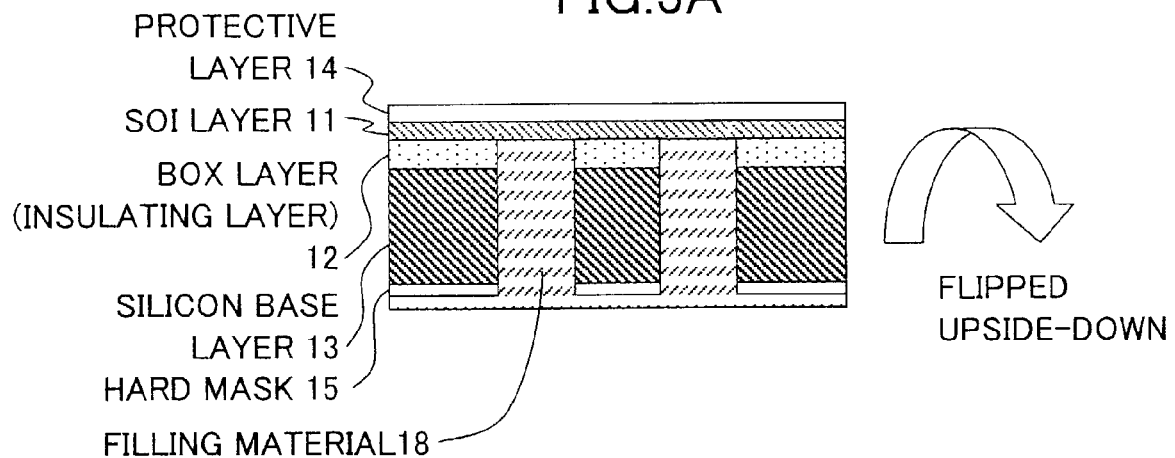
Figure 3B:
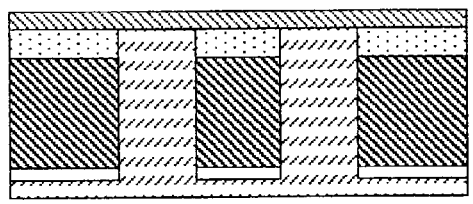

The mask blank 20 is then flipped upside-down (see FIG. 3A) and is wet etched with an HF solution or the like, thereby removing the protective layer 14 (FIG. 3B). Instead of the wet etching method, a dry etching method using plasma containing an F radical (e.g. $CHF_3$, $CF_4$) may also be used for this process.

Figure 3C:
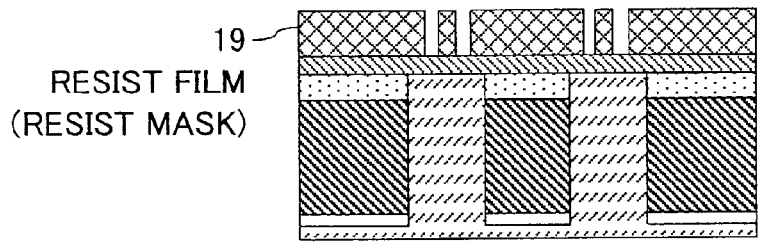
Figure 3D:
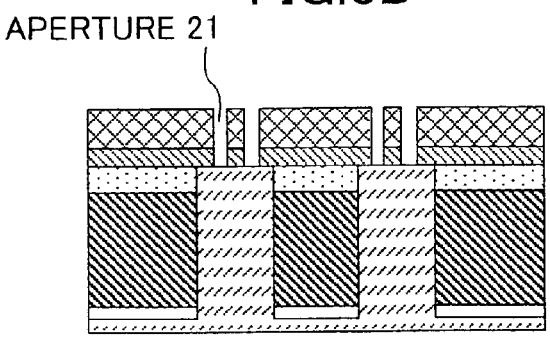

The front surface of the SOI layer 11 is spin-coated with resist to form a coating having, for example, a 3 micrometer thickness, and is then lithographically processed, thereby forming a resist film (resist mask) 19 with a prescribed pattern (See FIG. 3C).

With the resist film 19 serving as a mask, the SOI layer 11 is then dry etched with a halogen-based gas (e.g. $SF_6$), thereby forming an aperture 21 in the SOI layer 11. Simultaneous to this dry etching process is a partial removal of an upper portion of the resist film 19.

Figure 4A:
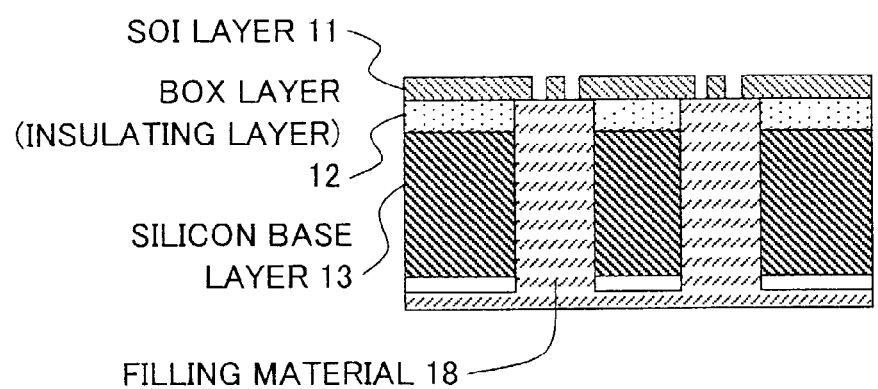
Figure 4B:
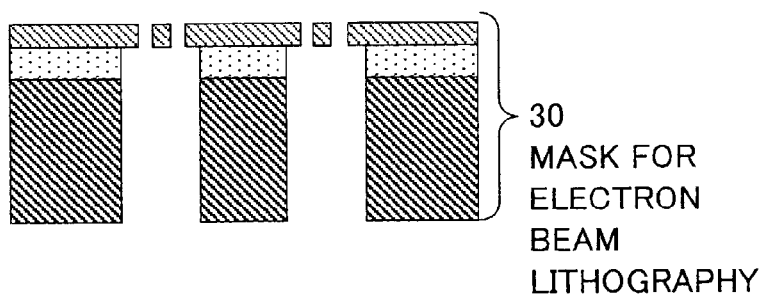

The mask blank 20 is then ashed with oxygen plasma for removing the resist film 19 therefrom (See FIG. 4A).

The filling material 18 is then removed by wet etching with HF or a combination of HF and $NH_4F$ (Filling material removal process). Scum from the etching process is then cleaned and removed by cleaning with an organic solvent or the like (See FIG. 4B). In consequence, the process of manufacturing a mask for electron beam lithography 30 is completed, in which the mask for electron beam lithography 30 has the SOI layer 11 formed with the aperture 21 for transmitting an electron beam therethrough.

In describing the method for manufacturing a mask for electron beam lithography, the batch process type thermal processing apparatus and the single wafer process type thermal processing apparatus are used as examples for performing the process of forming the protective layer and the process of forming the hard mask at once for providing efficient productivity; nevertheless, other coating methods may also be used, for example, a chemical vapor deposition method (CVD method), a spin-on coating method, or a method of adhering a sheet-like film.

In using the above-given methods, the front side and back side of the SOI substrate 10 are processed one side at a time, in which the protective layer 14 and the hard mask 15 can be separately formed with a prescribed thickness, respectively.

The above-given methods also have an advantage of being able to maintain the initial thickness of the SOI layer since the protective layer or the hard mask are formed separately upon the SOI layer.

Figure 8:
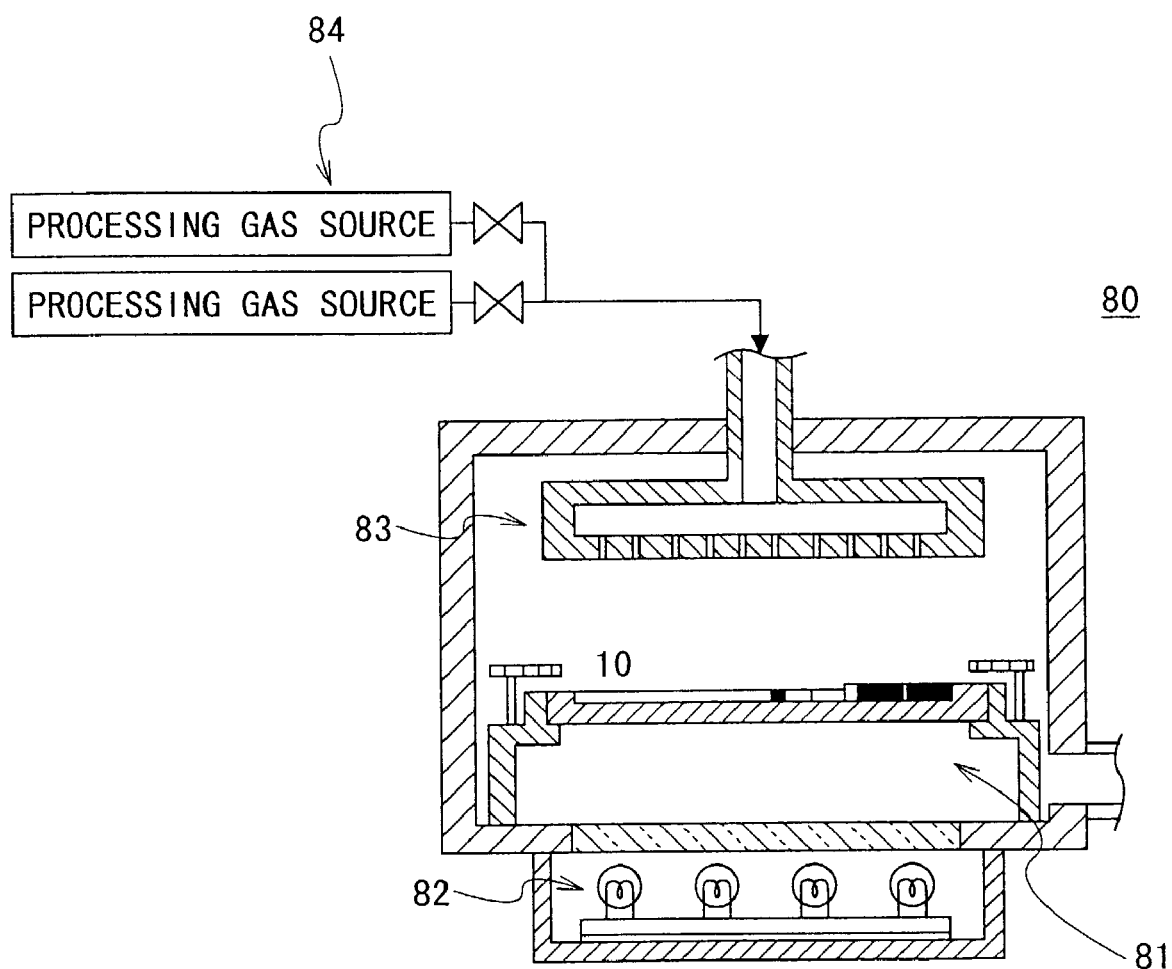
FIG. 8 is a schematic cross-sectional view of an apparatus for CVD (chemical vapor deposition) employed to a method for manufacturing a mask for electron beam lithography to which the present invention is applied.

In using the CVD method, the SOI substrate 10 is placed on a stage 81 inside an apparatus 80 shown in FIG. 8, in which the front side of the SOI substrate 10 (a side of the SOI layer 11) or the back side of the SOI substrate 10 is faced upward. The SOI substrate 10 is then heated by a heating lamp 82 arranged below the stage 81. A processing gas is then supplied from a shower plate 83 disposed opposite to the stage 81 for creating a chemical reaction, thereby forming a film, such as BPSG film, on the SOI substrate 10.

Figure 9:
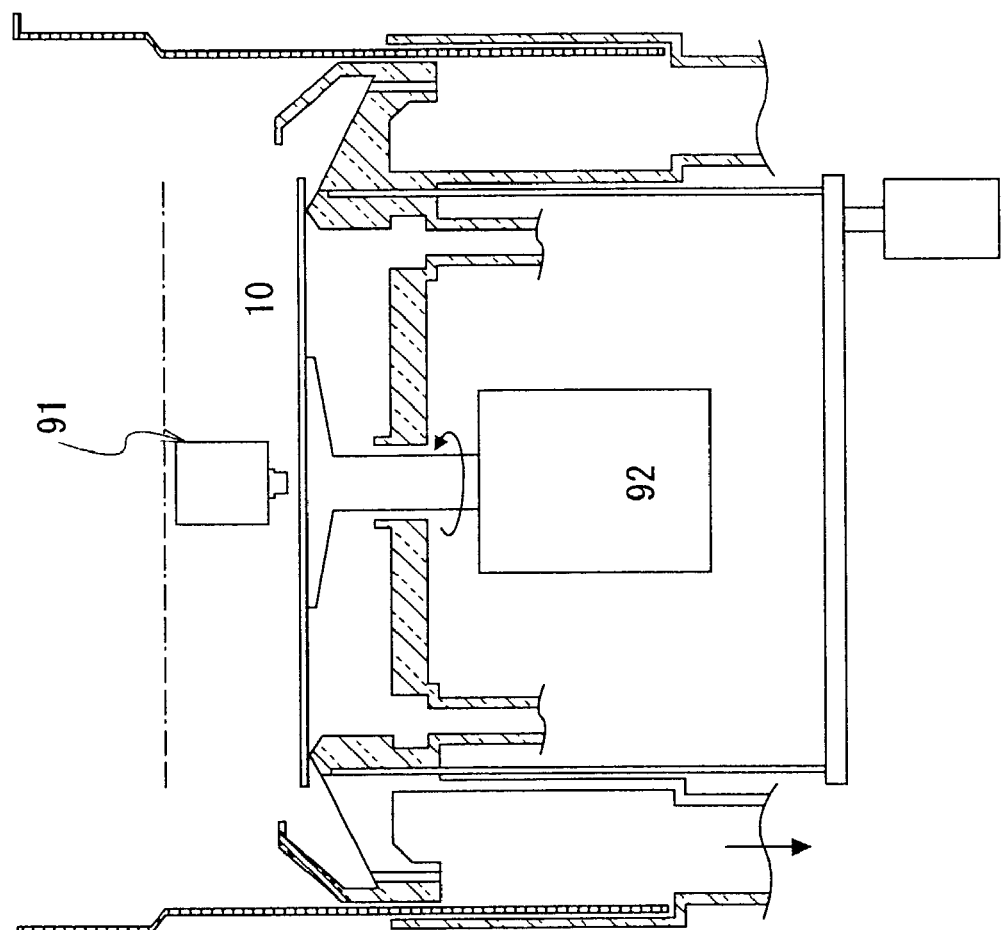
FIG. 9 is a schematic cross-sectional view of an apparatus for spin-on coating employed to a method for manufacturing a mask for electron beam lithography to which the present invention is applied.

In using the spin-on method, the SOI substrate 10 is placed inside an apparatus 90 shown in FIG. 9, in which an SOG (Spin On Glass) liquid (e.g. a mixture of a siloxane substance serving as a coating and an alcohol substance serving as a solvent) is applied from a nozzle 91 to the SOI substrate 10 rotated by a rotating mechanism 92. Subsequently, an SOG film is formed by thermally processing the SOI substrate 10 for evaporating a solvent or the like, and then by curing the coating of the SOI substrate 10. The SOG having a siloxane structure includes, for example, silica-glass, alkyl-siloxane-polymer, methyl-silsesquioxane-polymer (MSQ), hydrogen-sisesquioxane polymer (HSQ), and hydrido-organo-siloxane-polymer (HOSP).

In using the method of adhering a sheet-like film, a sheet-like member having low flammability (e.g. polyimide) can be adhered to the front and back side of the SOI substrate 10, thereby forming the protective layer and the hard mask.

In the aforementioned embodiment of a method for manufacturing a mask for electron beam lithography, it is possible to omit the process of filling the filling material into the space portion 17 and to advance to a next process for forming the lithographic mask 30 in a step where the space portion 17 is formed in a manner shown in FIG. 2C.

In the aforementioned embodiment for a method of manufacturing a mask for electron beam lithography, the order of the etching process for the silicon base layer 13 and the BOX layer 12 and the etching process for the SOI layer 11 may be reversed, that is, the etching process for the SOI layer can be performed before the etching process for the silicon base layer 13 and the BOX layer 12.

With the method for manufacturing a mask for electron beam lithography to which the present invention is applied, a protective layer is formed on the front side of the SOI layer (Protective layer forming process), and is removed, for example, prior to forming a resist mask on the SOI layer for etching the SOI layer and forming an aperture thereto (Protective layer removing process). Accordingly, a chuck or the like can be restrained from damaging the front side of the SOI layer for example, when the silicon base layer is processed. Therefore, the SOI layer can be patterned with no defect.

With another method for manufacturing a mask for electron beam lithography to which the present invention is applied, the forming of a protective layer on a front side of an SOI layer and the forming of a hard mask an a back side of a silicon base layer are performed simultaneously (Simultaneous protective layer and hard mask forming process), thereby, enabling the protective layer and the hard mask to be easily formed at once. Therefore, manufacture performance and productivity can be enhanced, and manufacture facilities can be utilized efficiently.

With another method for manufacturing a mask for electron beam lithography to which the present invention is applied, an insulating layer and a silicon base layer are etched for forming a space portion (aperture) thereto, a filling material is then filled into the space portion (aperture) of the insulating layer, and the silicon base layer (Filling material filling process), and the filling material is then removed after an aperture of the SOI layer is formed by etching the SOI layer (Filling material removing process). Accordingly, the space portion (aperture) formed in the silicon base layer and the insulating layer can be prevented from causing a problem such as deformation of the SOI layer during a process such as etching.

With a mask blank for electron beam lithography to which the present invention is applied, a protective layer is formed at least on a front side of an SOI layer. Accordingly, a chuck or the like can be prevented from damaging the front side of the SOI layer, for example, when the silicon base layer is processed. Therefore, the SOI layer can be patterned with no defect. Furthermore, the mask blank enables a resist mask to be formed on a back side of a silicon base layer without any complicated procedure, and also prevents problems caused by resist residue (scum) remaining thereto.

With another mask blank for electron beam lithography to which the present invention is applied, the mask blank is not only formed having a protective layer on a front side of an SOI layer thereof but is also formed having a hard mask on a back side of a silicon base layer thereof. Accordingly, the front side of the SOI layer and the back side of the silicon base layer can be protected from damage when handling (e.g. transporting, storing) the mask blank as an intermediary product.

With another mask blank for electron beam lithography to which the present invention is applied, the mask blank further includes a protective layer formed on a front side of an SOI layer, a filling material filled inside a space portion (aperture) formed in an insulating layer and a silicon base layer by etching the insulating layer and the silicon base layer, and a hard mask formed on a back side of the silicon base layer. Therefore, other than acquiring the same benefits as the aforementioned mask blank having the protective layer and the hard mask formed thereto, this mask blank also prevents the space portion (aperture) formed in the silicon base layer and the insulating layer from causing a problem such as deformation of the SOI layer during a process such as etching.

Other embodiments of the present invention will be described hereinafter.

1. A method of manufacturing a mask for electron beam lithography where the mask has an aperture formed by using a patterned resist mask for etching an SOI layer, an insulating layer, and a silicon base layer of an SOI substrate, respectively, in which a protective layer is formed by thermally oxidizing a front side of the SOI layer, and a hard mask is formed by thermally oxidizing a back side of the silicon base layer (Process for forming a protective layer and a hard mask).

2. A method of manufacturing a mask for electron beam lithography where the mask has an aperture formed by using a patterned resist mask for etching an SOI layer, an insulating layer, and a silicon base layer of an SOI substrate, respectively, in which a protective layer is formed by employing a CVD method (Chemical Vapor Deposition) to a front side of the SOI layer, and a hard mask is formed by employing the CVD method to a back side of the silicon base layer (Process for forming a protective layer and a hard mask).

3. A method of manufacturing a mask for electron beam lithography where the mask has an aperture formed by using a patterned resist mask for etching an SOI layer, an insulating layer, and a silicon base layer of an SOI substrate, respectively, in which a protective layer is formed by spin-coating a front side of the SOI layer, and a hard mask is formed by spin-coating a back side of the silicon base layer (Process for forming a protective layer and a hard mask).

4. A method of manufacturing a mask for electron beam lithography where the mask has an aperture formed by using a patterned resist mask for etching an SOI layer, an insulating layer, and a silicon base layer of an SOI substrate, respectively, in which a protective layer is formed by adhering a sheet-like film to a front side of the SOI layer, and a hard mask is formed by adhering a sheet-like film to a back side of the silicon base layer (Process for forming a protective layer and a hard mask).

5. A method of manufacturing a mask for electron beam lithography where the mask has an aperture formed by using a patterned resist mask for etching an SOI layer, an insulating layer, and a silicon base layer of an SOI substrate, respectively, in which a protective layer is formed by thermally oxidizing a front side of the SOI layer (Process for forming a protective layer).

6. A method of manufacturing a mask for electron beam lithography where the mask has an aperture formed by using a patterned resist mask for etching an SOI layer, an insulating layer, and a silicon base layer of an SOI substrate, respectively, in which a protective layer is formed by employing a CVD method to a front side of the SOI layer (Process for forming a protective layer).

7. A method of manufacturing a mask for electron beam lithography where the mask has an aperture formed by using a patterned resist mask for etching an SOI layer, an insulating layer, and a silicon base layer of an SOI substrate, respectively, in which a protective layer is formed by spin-coating a front side of the SOI layer (Process for forming a protective layer).

8. A method of manufacturing a mask for electron beam lithography where the mask has an aperture formed by using a patterned resist mask for etching an SOI layer, an insulating layer, and a silicon base layer of an SOI substrate, respectively, in which a protective layer is formed by adhering a sheet-like film to a front side of the SOI layer (Process for forming a protective layer).

9. A method of manufacturing a mask for electron beam lithography where the mask has an aperture formed by using a patterned resist mask for etching an SOI layer, an insulating layer, and a silicon base layer of an SOI substrate, respectively, in which a hard mask is formed by thermally oxidizing a back side of the silicon base layer (Process for forming a hard mask).

10. A method of manufacturing a mask for electron beam lithography where the mask has an aperture formed by using a patterned resist mask for etching an SOI layer, an insulating layer, and a silicon base layer of an SOI substrate, respectively, in which a hard mask is formed by employing a CVD method to a back side of the silicon base layer (Process for forming a hard mask).

11. A method of manufacturing a mask for electron beam lithography where the mask has an aperture formed by using a patterned resist mask for etching an SOI layer, an insulating layer, and a silicon base layer of an SOI substrate, respectively, in which a hard mask is formed by spin-coating a back side of the silicon base layer (Process for forming a hard mask).

12. A method of manufacturing a mask for electron beam lithography where the mask has an aperture formed by using a patterned resist mask for etching an SOI layer, an insulating layer, and a silicon base layer of an SOI substrate, respectively, in which a hard mask is formed by adhering a sheet-like film to a back side of the silicon base layer (Process for forming a hard mask).

13. A mask blank for electron beam lithography being prepared as a blank for manufacturing a mask formed with an aperture by using a patterned resist mask for etching an SOI layer, an insulating layer, and a silicon base layer of an SOI substrate, respectively, in which the mask blank is formed with a protective layer at least on a front side of the SOI layer by thermally oxidizing the front side of the SOI layer.

14. A mask blank for electron beam lithography being prepared as a blank for manufacturing a mask formed with an aperture by using a patterned resist mask for etching an SOI layer, an insulating layer, and a silicon base layer of an SOI substrate, respectively, in which the mask blank is formed with a protective layer at least on a front side of the SOI layer by employing a CVD method to the front side of the SOI layer.

15. A mask blank for electron beam lithography being prepared as a blank for manufacturing a mask formed with an aperture by using a patterned resist mask for etching an SOI layer, an insulating layer, and a silicon base layer of an SOI substrate, respectively, in which the mask blank is formed with a protective layer at least on a front side of the SOI layer by spin-coating the front side of the SOI layer.

16. A mask blank for electron beam lithography being prepared as a blank for manufacturing a mask formed with an aperture by using a patterned resist mask for etching an SOI layer, an insulating layer, and a silicon base layer of an SOI substrate, respectively, in which the mask blank is formed with a protective layer at least on a front side of the SOI layer by adhering a sheet-like film to the front side of the SOI layer.

17. A mask blank for electron beam lithography being prepared as a blank for manufacturing a mask formed with an aperture by using a patterned resist mask for etching an SOI layer, an insulating layer, and a silicon base layer of an SOI substrate, respectively, in which the mask blank is formed with a hard mask at least on a back side of the silicon base layer by thermally oxidizing the back side of the silicon layer.

18. A mask blank for electron beam lithography being prepared as a blank for manufacturing a mask formed with an aperture by using a patterned resist mask for etching an SOI layer, an insulating layer, and a silicon base layer of an SOI substrate, respectively, in which the mask blank is formed with a hard mask at least on a back side of the silicon base layer by employing a CVD method to the back side of the silicon base layer.

19. A mask blank for electron beam lithography being prepared as a blank for manufacturing a mask formed with an aperture by using a patterned resist mask for etching an SOI layer, an insulating layer, and a silicon base layer of an SOI substrate, respectively, in which the mask blank is formed with a hard mask at least on a back side of the silicon base laser by spin-coating the back side of the silicon base layer.

20. A mask blank for electron beam lithography being prepared as a blank for manufacturing a mask formed with an aperture by using a patterned resist mask for etching an SOI layer, an insulating layer, and a silicon base layer of an SOI substrate, respectively, in which the mask blank is formed with a hard mask at least on a back side of the silicon base layer by adhering a sheet-like film to the back side of the silicon base layer.

Further, the present invention is not limited to these embodiments, but various variations and modifications may be made without departing from the scope of the present invention.

The present application is based on Japanese priority application No. 2001-370579 filed on Dec. 4, 2001 with the Japanese Patent Office, the entire contents of which are hereby incorporated by reference.

What is claimed is:

1. A method for manufacturing a mask for electron beam lithography, comprising:
   providing an SOI substrate having a silicon base layer, an insulating layer arranged on the silicon base layer, and an SOI layer arranged on the insulating layer;
   forming a protective layer on a front side of the SOI layer simultaneously with forming a hard mask layer on a back side of the silicon base layer;
   forming a resist film on the hard mask layer;
   patterning the resist film to form a mask for etching the hard mask layer;
   etching the hard mask layer using the patterned resist film as a mask to form a hard mask;
   etching the silicon base layer using the etched hard mask as a mask;
   etching the insulating layer;
   removing the protective layer formed on the front side of the SOI layer; and
   etching the SOI layer after the protective layer is removed from the front side of the SOI layer.

2. The method for manufacturing a mask for electron beam lithography as claimed in claim 1, wherein the resist film is formed with a thickness of approximately 3 micrometers.

3. A method for manufacturing a mask blank comprising the steps of:
- providing an SOI substrate having a silicon base layer, an insulating layer arranged on the silicon base layer, and an SOI layer arranged on the insulating layer;
- forming a protective layer on a front side of the SOI layer simultaneously with forming a hard mask layer on a back side of the silicon base layer;
- forming a resist film on the hard mask layer;
- patterning the resist film to form a mask for etching the hard mask layer;
- etching the hard mask layer using the patterned resist film as a mask to form a hard mask;
- etching the silicon base layer using the etched hard mask as a mask; and
- etching the insulating layer.

4. The method for manufacturing a mask blank as claimed in claim 3, wherein the resist film is formed with a thickness of approximately 3 micrometers.

5. The method for manufacturing a mask blank as claimed in claim 3, further comprising a step of:
- filling a filling material into a space portion formed by the etching of the silicon base layer and the insulating layer.

6. The method for manufacturing a mask blank as claimed in claim 5, wherein the filling material includes at least one of a SOG film, an $SiO_2$ film, an organic SOG film, and an organic resist film.

* * * * *